(12) United States Patent
Ozawa et al.

(10) Patent No.: US 7,067,983 B2
(45) Date of Patent: Jun. 27, 2006

(54) ELECTRO-OPTICAL DEVICE AND ELECTRONIC APPARATUS

(75) Inventors: Tokuro Ozawa, Suwa (JP); Yoichi Imamura, Chino (JP); Toshiyuki Kasai, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 66 days.

(21) Appl. No.: 10/847,282

(22) Filed: May 18, 2004

(65) Prior Publication Data

US 2005/0001247 A1    Jan. 6, 2005

(30) Foreign Application Priority Data

May 19, 2003  (JP)  ............................. 2003-140972
Mar. 29, 2004  (JP)  ............................. 2004-095615

(51) Int. Cl.
*G09G 3/10* (2006.01)

(52) U.S. Cl. ............................... 315/169.1; 315/169.3; 345/204; 345/205

(58) Field of Classification Search ............. 315/169.3, 315/169.2, 169.1; 345/76–81, 92, 205, 204; 257/E21.134, E21.413, E21.703, E27.111, 257/E29.278; 313/257, 268; 349/69
See application file for complete search history.

(56) References Cited

U.S. PATENT DOCUMENTS

| 5,930,607 A |  | 7/1999 | Satou ........................ 438/158 |
| 6,420,834 B1 | * | 7/2002 | Yamazaki et al. ....... 315/169.3 |
| 6,528,950 B1 | * | 3/2003 | Kimura ................... 315/169.3 |
| 6,587,086 B1 | * | 7/2003 | Koyama ....................... 345/77 |
| 6,765,549 B1 | * | 7/2004 | Yamazaki et al. ............ 345/80 |

FOREIGN PATENT DOCUMENTS

| JP | A1 WO97/13177 | 4/1997 |
| JP | A1 WO98/12689 | 3/1998 |

* cited by examiner

*Primary Examiner*—Haissa Philogene
(74) *Attorney, Agent, or Firm*—Oliff & Berridge, PLC

(57) ABSTRACT

The invention provides an electro-optical device that can include a plurality of scanning lines, a plurality of signal lines, a plurality of pixels arranged corresponding to intersections of the scanning lines and the signal lines, and heat-release sections. The pixels can each include corresponding transistors and corresponding light-emitting elements, the light-emitting elements emit light in the direction that light is withdrawn, and the heat-release sections include heat release portions, located on the side opposite to the light-withdrawing direction of the light-emitting elements, having electrical conductivity. Accordingly, the invention can enhance the environmental resistance of an electro-optical device including light-emitting elements.

20 Claims, 6 Drawing Sheets

ELECTRO-OPTICAL DEVICE AND ELECTRONIC APPARATUS

BACKGROUND OF THE INVENTION

1. Field of Invention

The present invention relates to electro-optical devices and electronic apparatuses. The invention particularly relates to an electro-optical device including a light-emitting element having high heat resistance and light resistance and also relates to an electronic apparatus.

2. Description of Related Art

In recent years, displays including OLEDs (organic light-emitting diodes) functioning as display elements have been attracting much attention. The OLEDs belong to the category of a current-driven light-emitting diode that emits light depending on a current flowing in the diode. In order to display an image using the OLEDs arranged in a matrix, active matrix addressing is used.

For example, PCT Japanese Translation Patent Publication No. WO98/12689 discloses an active element, including a polysilicon thin-film transistor, for active matrix addressing. A report (J. Kanicki, J. H. Kim (Univ. of Michigan), AMLCD02 Tech. Digest, p. 81) made by J. Kanicki et al. discloses an active element including an amorphous thin-film transistor. Furthermore, it is known, for example, that PCT Japanese Translation Patent Publication No. WO97/13177 discloses a method for manufacturing an active matrix substrate including amorphous silicon thin-film transistors although the OLEDs are not used as display elements.

SUMMARY OF THE INVENTION

In general, light-emitting elements are low in luminous efficiency, and OLEDs are particularly inferior in luminous efficiency and convert received energy into heat. Since current-luminance characteristics of the OLEDs are rapidly deteriorated due to heat generated therefrom during light emission, the display performance of electro-optical devices including the OLEDs cannot be maintained. Furthermore, since emitted light enters channel regions of thin-film transistors for controlling gradation or retaining image signals, tone reproducibility cannot be satisfactorily maintained. It is an object of the invention to solve such problems, caused by the light-emitting elements, using an electro-optical device having a new configuration.

An electro-optical device of the invention can include a substrate a plurality of scanning lines, a plurality of signal lines, a plurality of pixel regions arranged corresponding to intersections of the scanning lines and the signal lines, and heat-release sections, those lines and regions being placed on the substrate. The pixel regions each include corresponding light-emitting elements and corresponding driving circuits for driving the light-emitting elements, the light-emitting elements emit light in the direction that light is withdrawn, and the heat-release sections are located on the side opposite to the light-withdrawing direction of the light-emitting elements.

Since the heat generated from the light-emitting elements is released through the heat-release sections, the electro-optical device has high heat resistance. The heat-release sections contain, for example, an opaque material such as because such a material has high thermal conductivity. Since the heat-release sections are located on the side opposite to the light-withdrawing direction of the light-emitting elements, the heat-release sections cause no harm in displaying an image. The electro-optical device can display an image without depending on the ambient temperature. In particular, when the light-emitting elements include OLEDs including light-emitting layers containing an organic material and the heat-release sections that have a large thickness so as to efficiently transmit the heat are placed above the OLEDs, stress is applied to the OLEDs from the heat-release sections; hence, the OLEDs are deteriorated. Thus, the light-withdrawing direction is preferably opposite to a direction in which the substrate is placed and the heat-release sections are preferably placed between the light-emitting elements and the substrate.

In the above electro-optical device, the heat-release sections can each extend from corresponding luminous sections to corresponding non-luminous sections and heat generated from the light-emitting elements is transmitted to portions of the heat-release sections extending in the non-luminous sections. The heat can be efficiently released from the light-emitting elements depending on a difference in temperature between regions containing the light-emitting elements and other regions containing no light-emitting elements. Furthermore, the heat-release sections extending in the non-luminous sections may each extend to corresponding non-luminous portions each placed in the corresponding pixel regions or extend to an outer area surrounding an area containing a plurality of the pixel regions.

The non-luminous portions in the pixel regions correspond to area portions containing partitions, when the pixel regions are isolated from each other with the partitions depending on pixel electrodes. Alternatively, the non-luminous portions may correspond to area portions containing the scanning lines, the signal lines, electric power lines, or the driving circuits each placed in the corresponding pixels. The outer area surrounding an area containing a plurality of the pixel regions corresponds to a narrow area between the perimeter of the substrate and the area containing the pixel regions. The narrow area includes an area portion containing dummy pixels, placed due to manufacturing reasons, having no display function.

Furthermore, the heat-release sections contain the same material as that for forming any one of electrodes connected to the driving circuits and have the same layer structure as that of the electrode. The electrode coupled to the driving circuits corresponds to the gate electrode, source electrode, or drain electrode of a thin-film transistor when the transistor is placed in each driving circuit or corresponds to one of a pair of electrodes for forming a capacitor when the capacitor is placed in the driving circuit. When the electro-optical device of the present invention is of a matrix type, the heat-release sections may contain the same material as that for forming connection wires for connecting elements in the pixels each other and have the same layer structure as that of the connection wires, which contain the same material as that for forming the scanning lines, the signal lines, and/or the electric power lines and have the same layer structure as that of the scanning lines, the signal lines, and/or the electric power lines. According to such a configuration, the heat-release sections can be prepared without increasing the number of manufacturing steps.

Furthermore, in the electro-optical device, the distance between each heat-release section and the electrode connected to the driving circuit is greater than or equal to the thickness of an insulating layer disposed between the light-emitting elements and the heat-release sections and is less than or equal to the pitch between the pixel regions. The insulating layer disposed between the light-emitting elements and the heat-release sections corresponds to a gate insulating layer, an interlayer insulating layer, or the like when the driving circuit includes a thin-film transistor. According to such a configuration, heat can be released from the light-emitting elements to the heat-release sections before the heat causes negative effects on the transistors. Therefore, heat drift can be prevented from affecting the transistors. Hence, the electro-optical device does not depend on temperature changes.

In the electro-optical device, the heat-release sections have a thermal conductivity greater than or equal to that of a first electrode that is one of a plurality of electrodes connected to the light-emitting elements and has the highest thermal conductivity. In order to obtain such a configuration, the heat-release sections may have a thickness greater than that of the first electrode or a thermal conductivity greater than that of the first electrode. Since the heat-release sections have a thermal conductivity greater than or equal to that of the first electrode having the highest thermal conductivity, heat can be efficiently released from the light-emitting elements to the heat-release sections; hence, the electro-optical device has high heat resistance.

In the electro-optical device, a plurality of the pixel regions each can include corresponding heat-conductive sections, each disposed between the corresponding heat-release sections and the corresponding light-emitting elements, each including at least one first heat-conductive layer.

Since the pixel regions include heat-conductive sections, heat generated from the light-emitting element can be efficiently transmitted to the heat-release sections and temporarily stored in the heat-conductive sections uniformly. Therefore, the temperature distribution in the pixel regions is uniform and the luminance of the light-emitting elements in the pixel regions is uniform; hence, the electro-optical device displays a uniform image.

Furthermore, in the electro-optical device, the heat-conductive sections each include corresponding second heat-conductive layers located on the side close to the light-emitting elements and the second heat-conductive layers have a thermal conductivity less than that of the first heat-conductive layers. According to such a configuration, heat generated from the light-emitting element can be temporarily stored in the heat-conductive sections uniformly.

In the electro-optical device, the heat-conductive sections are each disposed between the corresponding driving circuits and the corresponding light-emitting elements and each include corresponding third heat-conductive layers located on the side close to the driving circuits, and the third heat-conductive layers have a thermal conductivity less than that of the first heat-conductive layers. According to such a configuration, the propagation of heat to the transistors can be minimized and heat drift can therefore be prevented from affecting the transistors; hence, the electro-optical device does not depend on temperature changes.

In the electro-optical device, the heat-release sections or the heat-conductive sections are each disposed between the corresponding driving circuits and the corresponding light-emitting elements and function as portions of light-shielding section for shielding the driving circuits from light emitted from the light-emitting elements. Furthermore, the heat-release sections have faces facing the light-emitting elements and the faces or the second heat-conductive layers absorb at least light. The electro-optical device may further include partitions, disposed above the driving circuits, for isolating the luminous sections from each other. The partitions have faces fronting in the light-withdrawing direction and the faces absorb at least light. The distance between the driving circuits and luminous portions of the light-emitting elements is preferably greater than or equal to the distance between the partitions and the heat-release sections or the heat-conductive sections and less than or equal to the pitch between the pixels. According to such a configuration, light entering the transistors can be reliably attenuated. Hence, the electro-optical device has high reproducibility in tone properties.

When an electronic apparatus includes the electro-optical device described above, the electronic apparatus has high display performance. Hence, the sales appeal of the apparatus can be enhanced.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Figure 2:
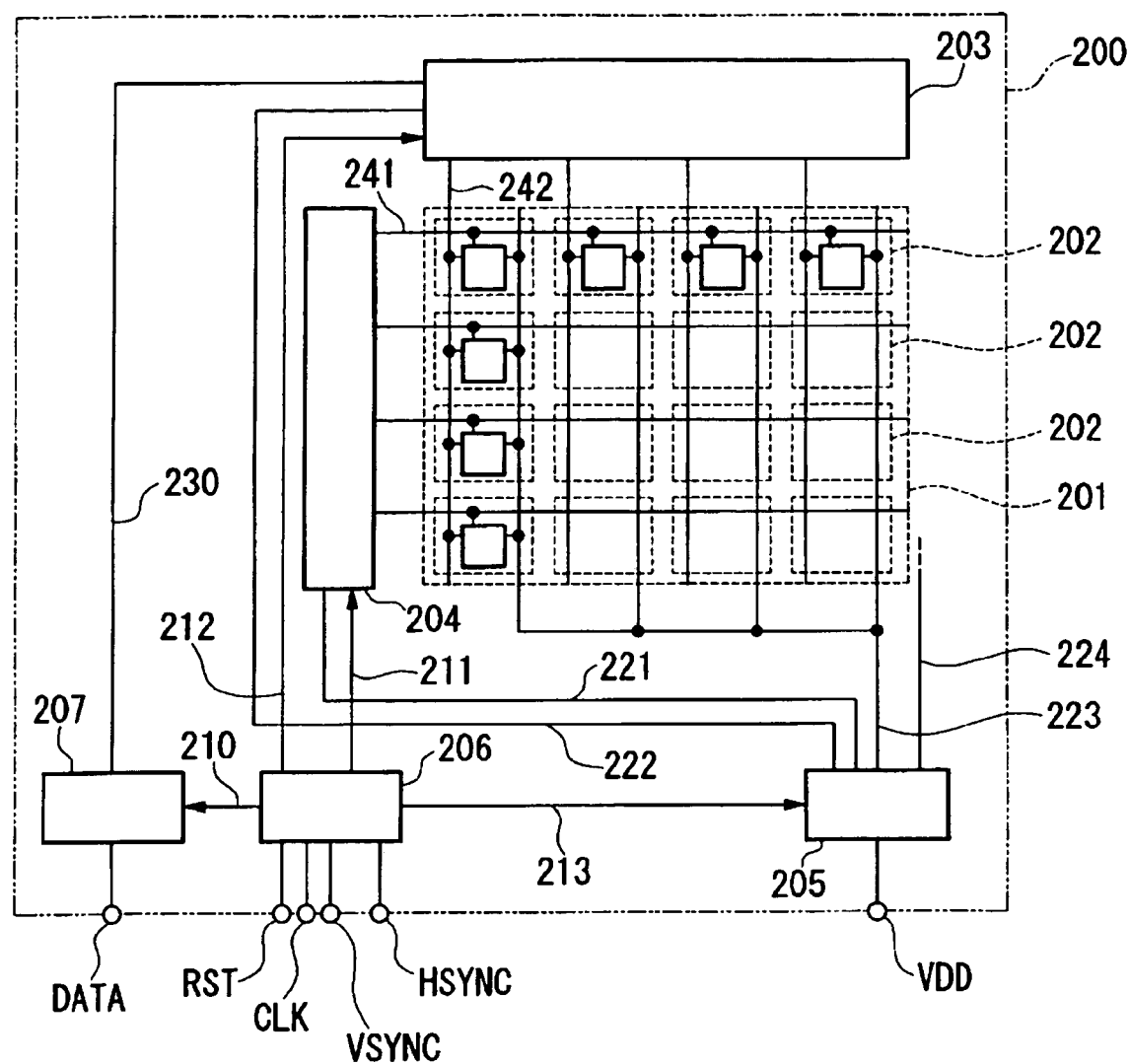
FIG. 2 is an illustration showing a configuration of an electro-optical device according to an embodiment of the invention.
Figure 3:
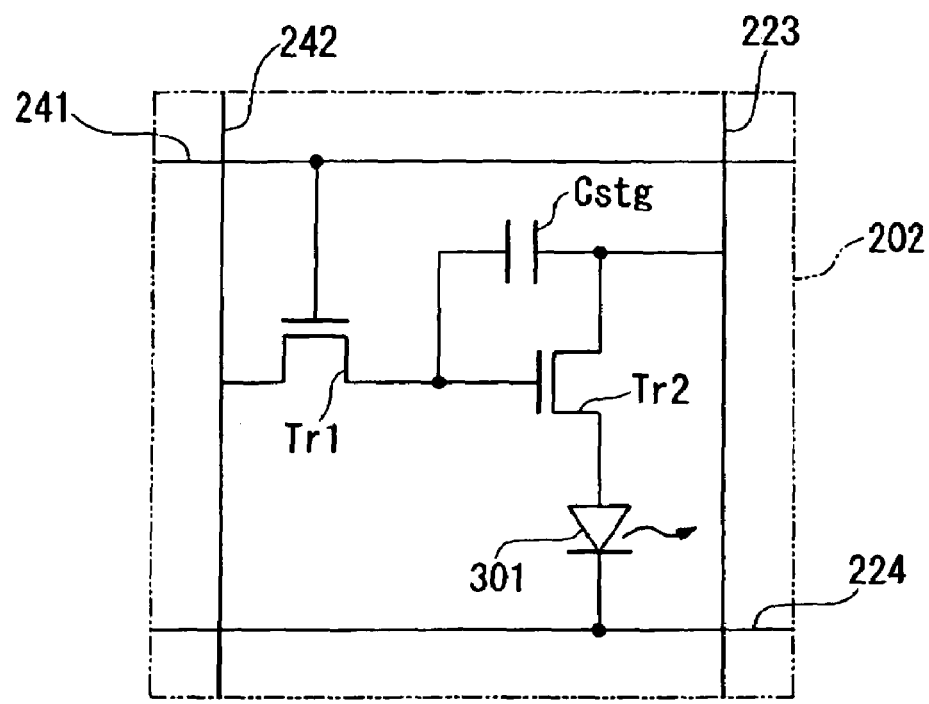
FIG. 3 is an illustration showing a configuration of a pixel placed in an electro-optical device according to an embodiment of the invention.

FIG. 2 is an illustration showing a configuration of an electro-optical device according to an embodiment of the invention, the electro-optical device being an organic electroluminescent (EL) device in particular. FIG. 3 is an illustration showing a configuration of one of active matrix pixels placed in the electro-optical device of this embodiment. The electro-optical device will now be described with reference to FIGS. 2 and 3.

The electro-optical device 200 has an effective viewing area 201 including a plurality of pixel regions 202 arranged in a matrix. The electro-optical device 200 further includes a plurality of gate wires 241 and source wires 242, intersecting each other, for applying arbitrary image signals to the pixel regions 202. The pixel regions 202 are coupled to each other and arranged depending on the intersections. The pixel regions 202 each include corresponding OLEDs 301 and pixel-driving circuits for each driving the corresponding OLEDs 301. A gate line-driving circuit 204 outputs selection signals or non-selection signals, which are supplied to the gate wires 241. A source line-driving circuit 203 outputs image signals, which are supplied to the source wires 242. The image signals output during a particular period of time are transmitted to a group of pixels to which the selection signals have been supplied, and the image signals output during the next period are transmitted to the next group of pixels to which the selection signals have been supplied. The repetition of the above operation allows arbitrary image signals to be transmitted to the pixels arranged in a matrix.

The pixel-driving circuits of the pixel regions 202 can each include corresponding switching first thin-film transistors Tr1 arranged corresponding to the intersections of the gate wires 241 and the source wires 242. The gate electrodes of the first thin-film transistors Tr1 are each connected to the corresponding gate wires 241, the source electrodes thereof are each connected to the corresponding source wires 242, and the drain electrodes thereof are each connected to corresponding gate electrodes of second thin-film transistors Tr2 for controlling the tone of an image. The first thin-film transistors Tr1 are turned on depending on the selection signals supplied to the gate wires 241, whereby the image signals supplied to the source wires 242 can be supplied to the gate electrodes of the second thin-film transistors Tr2. In order to enhance the ability of retaining the image signals, the pixel-driving circuits may each include corresponding capacitors Cstg each placed in parallel to the corresponding gate electrodes of the second thin-film transistors Tr2.

The pixel regions 202 divided into groups are commonly connected to a first common electrode wire 223 and a second common electrode wire 224, in addition to the gate wires 241 and the source wires 242, for each group. The source electrodes of the second thin-film transistors Tr2 are commonly connected to the first common electrode wire 223 and the cathodes of the OLEDs (organic light-emitting diodes) 301 are commonly connected to the second common electrode wire 224. The drain electrodes of the second thin-film transistors Tr2 are each connected to the corresponding anodes of the OLED 301. According to such a configuration, currents controlled by the second thin-film transistors Tr2 flow through the first common electrode wire 223, the second thin-film transistors Tr2, the OLEDs 301, and then the second common electrode wire 224 to allow the OLEDs 301 to emit light with an arbitrary luminance. In the above configuration, the second common electrode wire 224 is connected to the cathodes of the OLEDs 301; however, the second common electrode wire 224 may be connected to the anodes of the OLEDs 301 depending on a method for forming layers, a method for driving the pixels, the direction of the forward current, and the like. Furthermore, the first and second common electrode wires 223 and 224 are each connected to corresponding common wires. However, other common electrode wires may be each connected to the OLEDs 301 depending on the colors of the OLEDs 301 or each connected to corresponding blocks of the pixels. Furthermore, the first and second common electrode wires 223 and 224 are described as wiring lines. However, it should be understood that they are not limited to such wiring lines, and may be common electrodes, formed without patterning each pixel, each connected to a plurality of the pixels.

The gate line-driving circuit 204 and the source line-driving circuit 203 are supplied with first timing control signals 211 and second timing control signals 212, respectively, from a timing control circuit 206 and supplied with electricity from a electricity-generating circuit 205 through a first electric power line 221 and a second electric power line 222, respectively. The first timing control signals 211 include, for example, a scan clock signal, scan start signal, selection permission signal, and initializing signal for driving the gate line-driving circuit 204. The second timing control signals 212 include, for example, a sample clock signal, sample start signal, sample permission signal, and initializing signal for driving the source line-driving circuit 203. The first and second timing control signals 211 and 212 are generated by the timing control circuit 206 based on a horizontal synchronizing signal HSYNC, vertical synchronizing signal VSYNC, initializing signal RST, clock signal CLK, and so on supplied to the electro-optical device 200 from an external device. The first and electric power lines 221 and 222 are necessary for driving the gate line-driving circuit 204 and the source line-driving circuit 203, respectively. Those electric power lines transmit electricity produced in the electricity-generating circuit 205 by transforming source electricity VDD, supplied to the electro-optical device 200 from an external power supply, based on electricity control signals 213.

The source line-driving circuit 203 can further be supplied with image signals 230 from an image signal-processing circuit 207. The image signal-processing circuit 207 processes signals and converts, for example, serial source image signals DATA, supplied from an external device to the electro-optical device 200, into parallel signals based on image signal control signals 210 transmitted from the timing control circuit 206, thereby providing the image signals 230. In addition to the above conversion, the image signal-processing circuit 207 performs operations such as digital-to-analog conversion, analog-to-digital conversion, γ-correction table conversion, voltage level conversion, and color signal conversion in some cases.

According to the configuration described above, the pixel regions 202 emit light with a predetermined luminance depending on the source image signals DATA to allow the electro-optical device 200 to display an arbitrary image.

Figure 1:
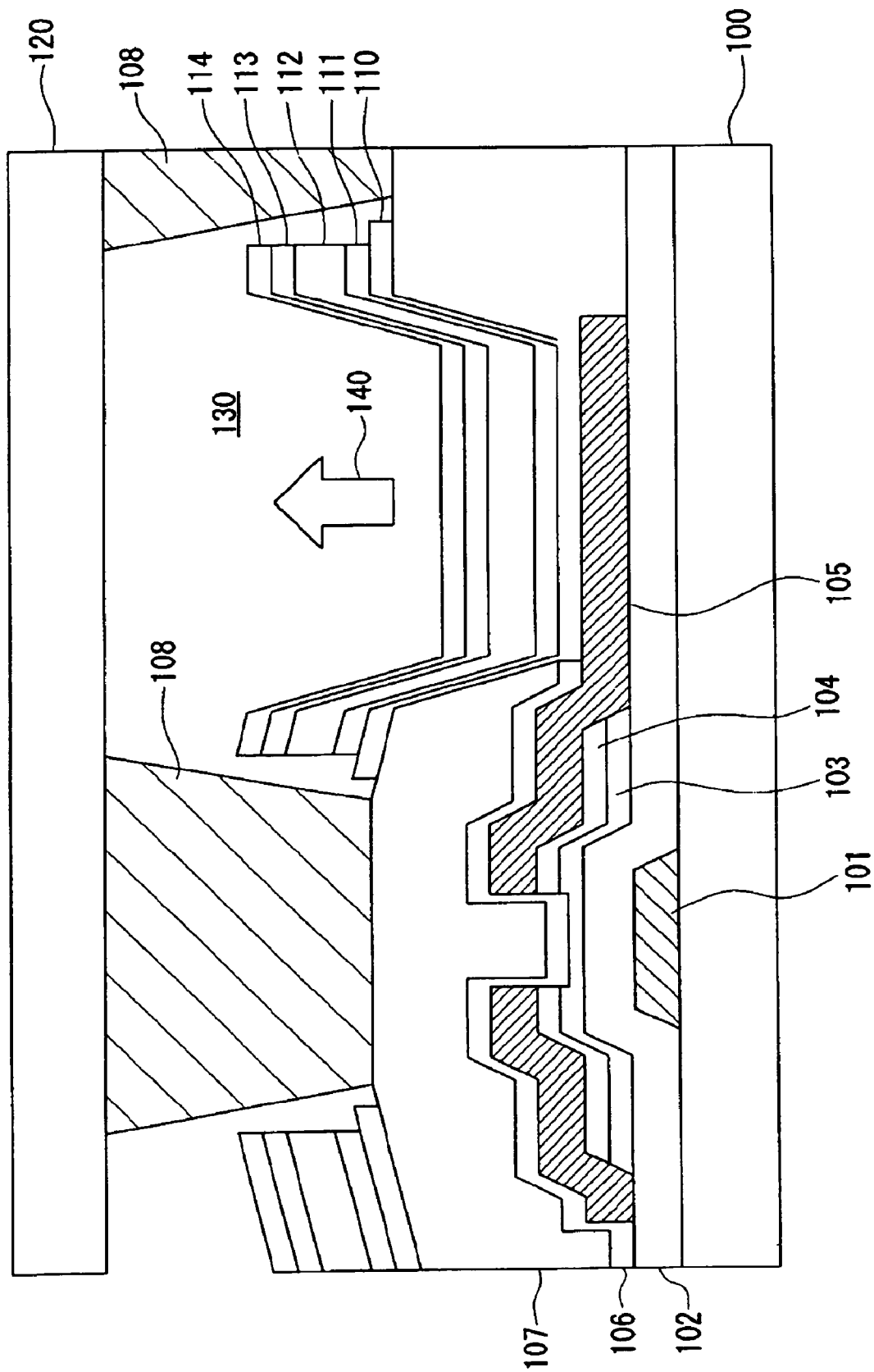
FIG. 1 is a sectional view showing a configuration of an electro-optical device according to an embodiment of the invention.

FIG. 1 is an illustration that shows a configuration of an electro-optical device according to an embodiment of the invention and illustrates a method for manufacturing the device. The configuration and components of the electro-optical device will now be described with reference to FIGS. 1 to 3.

First of all, first electrodes 101 are formed on an insulating substrate 100. Examples of the insulating substrate 100 can include electrically insulating, transparent substrates such as an alkali-free glass substrate, a sapphire substrate, and a heat-resistant plastic substrate and opaque substrates including monocrystalline silicon sheets, monocrystalline carbon-silicon sheets, or compound semiconductor sheets and insulating layers placed thereon. The first electrodes 101 contain an electrically conductive material that is opaque and heat-conductive. Examples of the electrically conductive material include metals, such as nickel, tantalum, chromium, aluminum, titanium, tungsten, molybdenum, copper, silver, gold, and platinum; alloys thereof; oxide semiconductors such as indium tin oxide, indium zinc oxide, zinc oxide, and tin oxide; and impurity semiconductors containing silicon and a high content of an impurity such as phosphorus or boron. The first electrodes 101 may have a multilayer structure or a graded layer structure in which the content of an element in the electrically conductive material is graded.

A pattern for preparing the first electrodes 101 is formed by a photoengraving process using a photosensitive resist material or a printing process such as an offset process or an ink-jet process using ink containing a solvent and the electrically conductive material dissolved or dispersed therein.

The first electrodes 101 are connected to the gate electrodes of the first and second thin-film transistors Tr1 and Tr2; the gate wires 241; one electrode of each capacitor Cstg; the gate electrodes of thin-film transistors for forming the gate line-driving circuit 204, the source line-driving circuit 203, the electricity-generating circuit 205, the timing control circuit 206, and the image signal-processing circuit 207; and various signal lines. The first electrodes 101 are preferably arranged in a layer in which the gate electrodes or the gate wires 241 are placed. According to such a configuration, the first electrodes 101 can be formed without increasing the number of preparing steps in such a manner that the first electrodes 101 each extend from corresponding luminous sections to corresponding non-luminous sections.

Subsequently, a first insulating layer 102 can be formed. Examples of a material for forming the first insulating layer 102 include electrical insulators, such as silicon dioxide, silicon nitride, silicon oxide nitride, hafnium oxide, aluminum oxide, yttrium oxide, and germanium oxide. The first insulating layer 102 may have a multilayer structure or a graded layer structure in which the content of an element in the insulating material is graded.

When the first insulating layer 102 must be patterned, the following process can be employed: a photoengraving process using a photosensitive resist material or a printing process such as an offset process or an ink-jet process using ink containing a solvent and the electrically insulating material dissolved or dispersed therein. When the photoengraving process is employed, patterning need not be performed in this step because etching can be performed in a subsequent step. When the printing process is used, droplets of the ink must be prevented from being placed on areas through which the first electrodes 101 are electrically connected to upper portions.

The first insulating layer 102 can be used for preparing gate insulating layers of the first and second thin-film transistors Tr1 and Tr2; the dielectric layers of the capacitors Cstg; gate insulating layers of the thin-film transistors for forming the gate line-driving circuit 204, the source line-driving circuit 203, the electricity-generating circuit 205, the timing control circuit 206, and the image signal-processing circuit 207; and the like.

Subsequently, intrinsic semiconductor layers 103 and impurity semiconductor layers 104 are formed in that order. Examples of a semiconductor material for forming the intrinsic semiconductor layers 103 and impurity semiconductor layers 104 include amorphous silicon, microcrystalline silicon, polysilicon, monocrystalline silicon, carbon-silicon, diamond, and germanium. The intrinsic semiconductor layers 103 are formed using the semiconductor material only or prepared by crystallizing layers formed using the semiconductor material. The impurity semiconductor layers 104 are formed using a mixture containing the semiconductor material and a high content of an impurity such as phosphorus or boron or prepared by heavily doping layers, formed using the semiconductor material, with such an impurity. In order to adjust threshold values, the intrinsic semiconductor layers 103 may contain a small amount of an impurity. The intrinsic semiconductor layers 103 and the impurity semiconductor layers 104 may have a multilayer structure or a graded layer structure in which the content of an element in the semiconductor material is graded.

When a pattern for forming the intrinsic semiconductor layers 103 or the impurity semiconductor layers 104 must be formed, the following process can be employed: a photoengraving process using a photosensitive resist material or a printing process such as an offset process or an ink-jet process using ink containing a solvent and the semiconductor material dispersed therein. In this embodiment, both the semiconductor layers are formed in this step by patterning in such a manner that the semiconductor layers have the same shape. Portions from which only the impurity semiconductor layers 104 are removed are etched in a subsequent step together with other layers.

The intrinsic semiconductor layers 103 are used for preparing active layers of the first and second thin-film transistors Tr1 and Tr2; active layers of the thin-film transistors for forming the gate line-driving circuit 204, the source line-driving circuit 203, the electricity-generating circuit 205, the timing control circuit 206, and the image signal-processing circuit 207; and the like. The impurity semiconductor layers 104 are used for preparing the drain electrodes of the first and second thin-film transistors Tr1 and Tr2; the drain electrodes of the thin-film transistors for forming the gate line-driving circuit 204, the source line-driving circuit 203, the electricity-generating circuit 205, the timing control circuit 206, and the image signal-processing circuit 207; a resistor placed in an electrostatic protection circuit placed in the electro-optical device 200; and the like.

Subsequently, second electrodes 105 are formed. The second electrodes 105 contain an electrically conductive material that is opaque and heat-conductive. Examples of the electrically conductive material include metals, such as nickel, tantalum, chromium, aluminum, titanium, tungsten, molybdenum, copper, silver, gold, and platinum; alloys thereof; oxide semiconductors such as indium tin oxide, indium zinc oxide, zinc oxide, and tin oxide; and impurity semiconductors containing silicon and a high content of an impurity such as phosphorus or boron. The second electrodes 105 may have a multilayer structure or a graded layer structure in which the content of an element in the electrically conductive material is graded.

A pattern for preparing the second electrodes 105 can be formed by a photoengraving process using a photosensitive resist material or a printing process such as an offset process or an ink-jet process using ink containing a solvent and the electrically conductive material dissolved or dispersed therein. In this embodiment, portions of the impurity semiconductor layers 104 and the intrinsic semiconductor layers 103 are etched using a mask for forming the second electrodes 105 while the second electrodes 105 are etched. Therefore, the intrinsic semiconductor layers 103 have a predetermined shape and can be separated from the impurity semiconductor layers 104 are removed.

The second electrodes 105 are connected to the drain electrodes of the first and second thin-film transistors Tr1 and Tr2; the drain electrodes of the thin-film transistors for forming the gate line-driving circuit 204, the source line-driving circuit 203, the electricity-generating circuit 205, the timing control circuit 206, and the image signal-processing circuit 207; resistors; various signal lines; and the like.

Subsequently, a second insulating layer 106 and a third insulating layer 107 are formed in that order. Examples of a material for forming the second insulating layer 106 include silicon dioxide, silicon nitride, silicon oxide nitride, and germanium oxide. Examples of a material for forming the third insulating layer 107 include resins, such as an acrylic polymer and polyimide. The resins may be photosensitive. The third insulating layer 107 may contain a black resin prepared by dispersing a light absorbing material, such as porous silicon, porous carbon, metal powder, or pigment in any one of the above resins.

In order to pattern the second insulating layer 106 and the third insulating layer 107, the following process is used: a photoengraving process using a photosensitive resin or a printing process such as an offset process or an ink-jet process using ink containing a solvent and the insulating material dissolved or dispersed therein. In this embodiment, the third insulating layer 107 containing such a photosensitive resin is exposed and then developed, and the second insulating layer 106 is then etched using the resulting third insulating layer 107 as a mask. In that operation, portions of the first electrodes 101 connected to upper regions can be uncovered by etching the first insulating layer 102 together with the second and third insulating layers 106 and 107.

The second and third insulating layers 106 and 107 electrically insulate the first and second thin-film transistors Tr1 and Tr2 from first OLED electrodes 110 described below, and also insulate the first OLED electrodes 110 from the thin-film transistors for forming the gate line-driving circuit 204, the source line-driving circuit 203, the electricity-generating circuit 205, the timing control circuit 206, and the image signal-processing circuit 207.

Subsequently, the first OLED electrodes 110 are formed. The first OLED electrodes 110 contain an electrically conductive material for injecting carriers into first OLED carrier injection layers 111 or OLED semiconductor layers 112 described below at high efficiency. Examples of the electrically conductive material include oxide semiconductors such as indium tin oxide, indium zinc oxide, zinc oxide, and tin oxide; alkali metals such as lithium, sodium, and potassium; alkaline-earth metals, such as calcium and strontium; metals, such as beryllium, magnesium, nickel, tantalum, chromium, aluminum, titanium, tungsten, molybdenum, copper, silver, gold, and platinum; and alloys thereof. The first OLED electrodes 110 may have a multilayer structure or a graded layer structure in which the content of an element in the electrically conductive material is graded.

A pattern for preparing the first OLED electrodes 110 is formed by a photoengraving process using a photosensitive resist material or a printing process such as an offset process or an ink-jet process using ink containing a solvent and the electrically conductive material dissolved or dispersed therein.

The first OLED electrodes 110 are components of OLEDs 301. In this embodiment, the first OLED electrodes 110 are used for connecting the drain electrodes of the first thin-film transistors Tr1 to the gate electrodes of the second thin-film transistors Tr2 and connected to the gate electrodes of thin-film transistors for forming the gate line-driving circuit 204, the source line-driving circuit 203, the electricity-generating circuit 205, the timing control circuit 206, and the image signal-processing circuit 207; resistors; various signal lines; and the like.

Subsequently, ribs (partitions) 108 are formed. The ribs 108 preferably contain a highly insulating material that is suitable for processing the side faces of the ribs 108 and suitable for increasing the thickness thereof. Examples of the highly insulating material include resins such as an acrylic polymer and polyimide. The ribs 108 may contain a black resin prepared by dispersing a light absorbing material such as porous silicon, porous carbon, metal powder, or pigment in any one of the above resins.

A pattern for preparing the ribs 108 is formed by a photoengraving process using a photosensitive resin or a printing process such as an offset process or an ink-jet process using ink containing a solvent and the highly insulating material dissolved or dissolved or dispersed therein. In this embodiment, the ribs 108 containing the photosensitive resin are formed by exposure and development. In that operation, when a black photosensitive resin that is of a negative type is used and the light exposure is reduced, the ribs 108 can be readily shaped such that they have a reverse trapezoidal shape (reverse-tapered shape) in cross section. Therefore, the ribs 108 can function as partitions for isolating layers, described below, from each other while the layers are formed by a deposition process. The ribs 108 also function as supports for supporting a counter substrate 120 described below.

Subsequently, the first OLED carrier injection layers 111, the OLED semiconductor layers 112, second OLED carrier injection layers 113, and second OLED electrodes 114 are formed in that order. The first and second OLED carrier injection layers 111 and 113 contain a material for injecting electrons or holes into the OLED semiconductor layers 112 at high efficiency. Examples of the material (hole injection layers) having high hole injection efficiency include polyethylenedioxythiophene, polyphenylenevinylene, polyaniline, porphyrin compounds, pyridine derivatives, 1,1-bis (4-N,N-ditolylaminophenyl)-cyclohexane, and tris(8-hydroxyhydroxyquinolinol) aluminum. Examples of the material (electron injection layers) having high electron injection efficiency include oxadiazole derivatives, DSA, aluminum-quinol complexes, Bebq, triazole derivatives, azomethine complexes, and porphyrin complexes. Each first OLED carrier injection layer 111 must function as one of a hole injection layer or an electron injection layer and each second OLED carrier injection layer 113 must function as the other depending on a configuration and/or a material of the OLEDs 301, that is, one of the first OLED carrier injection layer 111 and the second OLED carrier injection layer 113 must function as the hole injection layer and the other must function as the electron injection layer. Either one or both of the hole injection layer and the electron injection layer may be omitted depending on materials of the OLED semiconductor layers 112, first OLED electrodes 110, and second OLED electrodes 114. Examples of a material for forming the OLED semiconductor layers 112 include semiconductors such as poly(p-phenylenevinylene), polyalkylthiophenes including poly(2,5-thienylene vinylene), poly(p-phenylene), polyarylenevinylenes including poly(2,5-fluorene vinylene), polyalkylfluorenes, a pyrazoline dimer, quinolizine carboxylic acid, benzopyranoquinolizine, and a phenanthroline-europium complex. The OLED semiconductor layers 112 may contain a semiconductive material prepared by mixing any one of the semiconductors with a fluorescent dye such as DCM, rhodamine, rhodamine derivatives, perylene, quinacridone, rubrene, or DCJT. The materials described above may be used alone or in combination, and the first OLED carrier injection layers 111, the OLED semiconductor layers 112, and the second OLED carrier injection layers 113 may have a multilayer structure or a graded layer structure. The second OLED electrodes 114 contain an electrically conductive material for injecting carriers into the second OLED carrier injection layers 113 or the OLED semiconductor layers 112 at high efficiency. Examples of the electrically conductive material include oxide semiconductors such as indium tin oxide, indium zinc oxide, zinc oxide, and tin oxide; alkali metals such as lithium, sodium, and potassium; alkaline-earth metals such as calcium and strontium; metals such as beryllium, magnesium, nickel, tantalum, chromium, aluminum, titanium, tungsten, molybdenum, copper, silver, gold, and platinum; and alloys thereof. The second OLED electrodes 114 may have a multilayer structure or a graded layer structure in which the content of an element in the electrically conductive material is graded.

A pattern for preparing the first OLED carrier injection layers 111, the OLED semiconductor layers 112, the second OLED carrier injection layers 113, and the second OLED electrodes 114 is formed by a photoengraving process using a photosensitive resin, a printing process such as an offset process or an ink-jet process using ink containing a solvent and the electrically conductive material or the semiconductor material dissolved or dispersed therein, or a mask evaporation process using the ribs 108 as partitions for isolating layers from each other during the formation of the layers. In this embodiment, the mask evaporation process is used and the ribs 108 have a reverse trapezoidal shape (reverse-tapered shape) in cross section and function as the partitions. The first OLED carrier injection layers 111, the OLED semiconductor layers 112, the second OLED carrier injection layers 113, and the second OLED electrodes 114 are prepared by a sputtering process or a vapor deposition process in that order and those layers therefore have a predetermined shape.

Finally, spaces under the counter substrate 120 are filled with a filler 130. Examples of the filler 130 include an oxygen absorbent containing a resin and iron particles dispersed therein, a moisture absorbent, and a moisture-resistant epoxy resin. When a light-withdrawing direction 140 is the same as the direction from the OLED semiconductor layers 112 toward the counter substrate 120, the filler 130 is not used or contains a highly transparent material. The counter substrate 120 contains an electrically insulating, transparent material such as alkali-free glass, sapphire, or heat-resistant plastic. When the light-withdrawing direction 140 is reverse to the direction shown in FIG. 1, the counter substrate 120 may contain an opaque material such as metal. When the counter substrate 120 contains metal, the counter substrate 120 may be connected to the second OLED electrodes 114, whereby the counter substrate 120 is used as part of the second common electrode wire 224.

Figure 4:
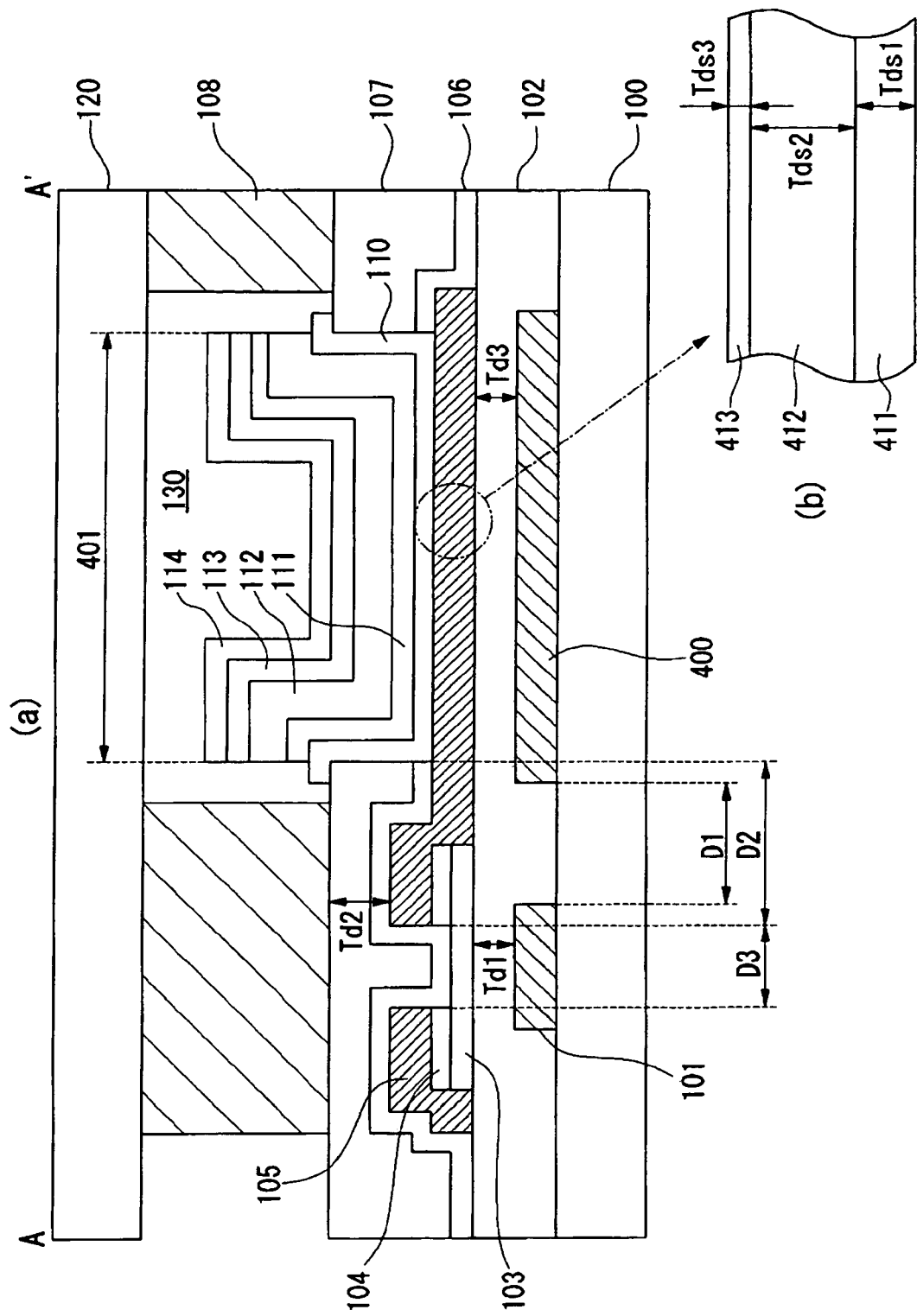
FIG. 4 is an illustration showing a heat-resistant structure and light-resistant structure of an electro-optical device according to an embodiment of the invention.

An example of an electro-optical device, having a heat-resistant structure and a light-resistant structure, according to an embodiment of the present invention will now be described with reference to FIGS. 4(a), 4(b), 5(a), 5(b), and 6. FIG. 4(a) is a sectional view showing the electro-optical device taken along the line A–A' of FIG. 6.

The electro-optical device shown in FIG. 4(a) is different from the electro-optical device shown in FIG. 1 in that the device of FIG. 4(a) includes heat-release sections 400 each extending in corresponding luminous sections 401. The heat-release sections 400 prevent the OLED semiconductor layers 112 from being deteriorated. The OLED semiconductor layers 112 are seriously deteriorated in current-luminance characteristic by heat generated therefrom during the emission of light. Therefore, the following problems can occur in some cases: a decrease in the luminance of the electro-optical device and an image sticking phenomenon in which a pattern of a previous image remains on an image.

In order to prevent such problems, the heat-release sections 400 are placed on the side opposite to the light-withdrawing direction 140. The heat-release sections 400 each extend from the luminous sections 401 to corresponding non-luminous sections and transmit heat from the luminous sections 401 to the non-luminous sections. The non-luminous sections may be each placed in corresponding pixel regions 202 or may be arranged in the periphery of an effective viewing area 201 including a plurality of the pixel regions 202. The non-luminous sections in the pixel regions 202 correspond to sections in which partitions 108 are placed when the pixel regions 202 are isolated from each other with the partitions 108 depending on pixel electrodes. Alternatively, the non-luminous sections correspond to sections in which the following components are arranged: gate wires 241, source wires 242, a first electric power line 221, and/or a pixel-driving circuit. The pixel-driving circuit includes, for example, first thin-film transistors Tr1, second thin-film transistors Tr2, and/or capacitors Cstg. The periphery of the effective viewing area 201 corresponds to a narrow area between the effective viewing area 201 and the perimeter of an insulating substrate 100. The narrow area includes a dummy pixel area 54 containing dummy pixels, placed due to manufacturing reasons, having no display function.

Figure 5A:
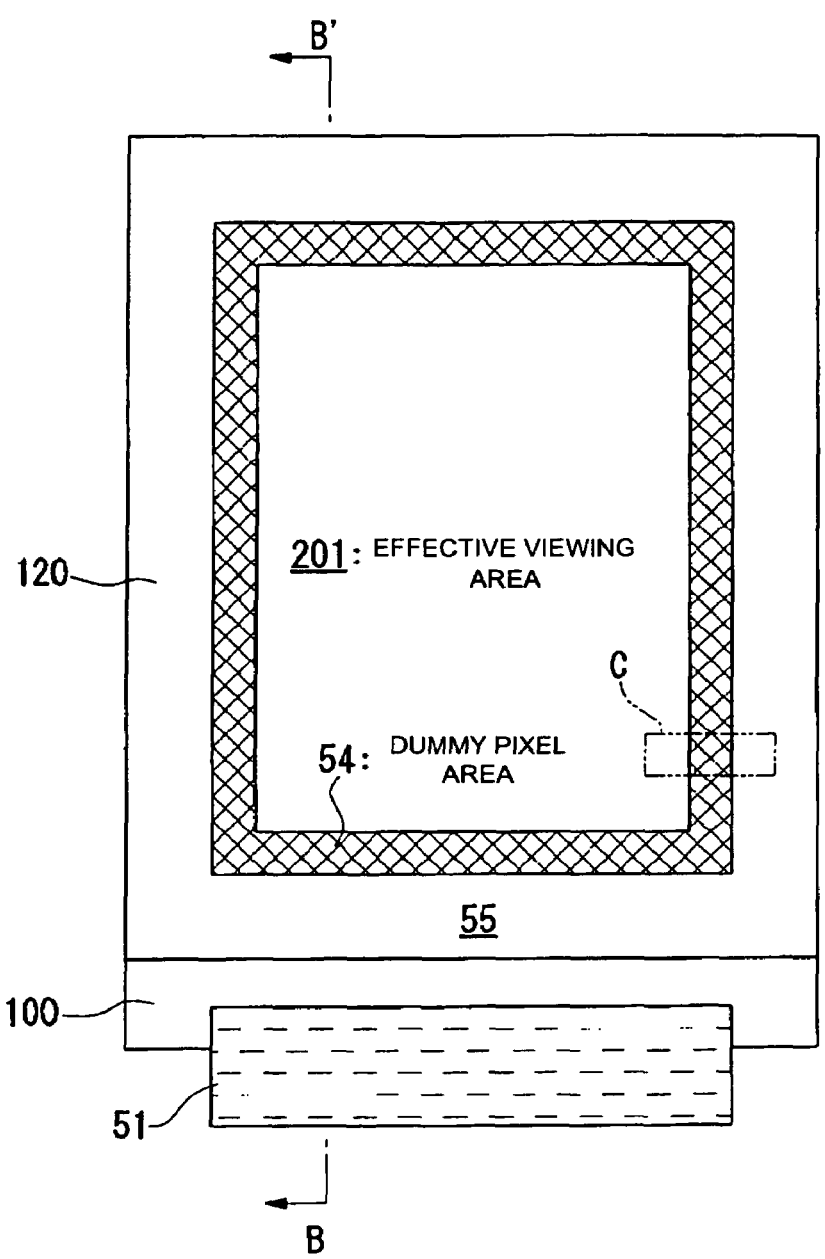
FIG. 5 is an illustration showing an entire configuration of an electro-optical device according to an embodiment of the invention.
Figure 5B:
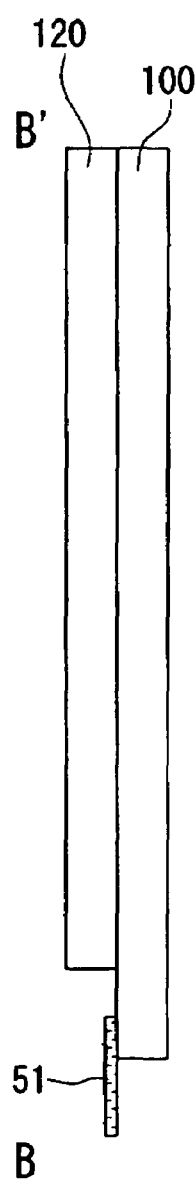

FIG. 5 is an illustration showing an entire configuration of the electro-optical device of this embodiment. FIG. 5(a) is a plan view thereof and FIG. 5(b) is a sectional view thereof taken along the line B–B' of FIG. 5(a).

A counter substrate 120 is placed on the insulating substrate 100 including OLEDs 301, the first and second thin-film transistors Tr1 and Tr2, and the like. The insulating substrate 100 is larger in size than the counter substrate 120 and a portion of the insulating substrate 100 extends past an outer edge of the counter substrate 120. An external board 51 including electronic components, such as driving ICs is placed on the extending portion.

The effective viewing area 201 containing pixels arranged in a matrix occupies the center of the insulating substrate 100, the dummy pixel area 54 containing the dummy pixels having no display function surrounds the effective viewing area 201, and a non-display area 55 containing no pixels corresponds to the outermost region.

Figure 6:
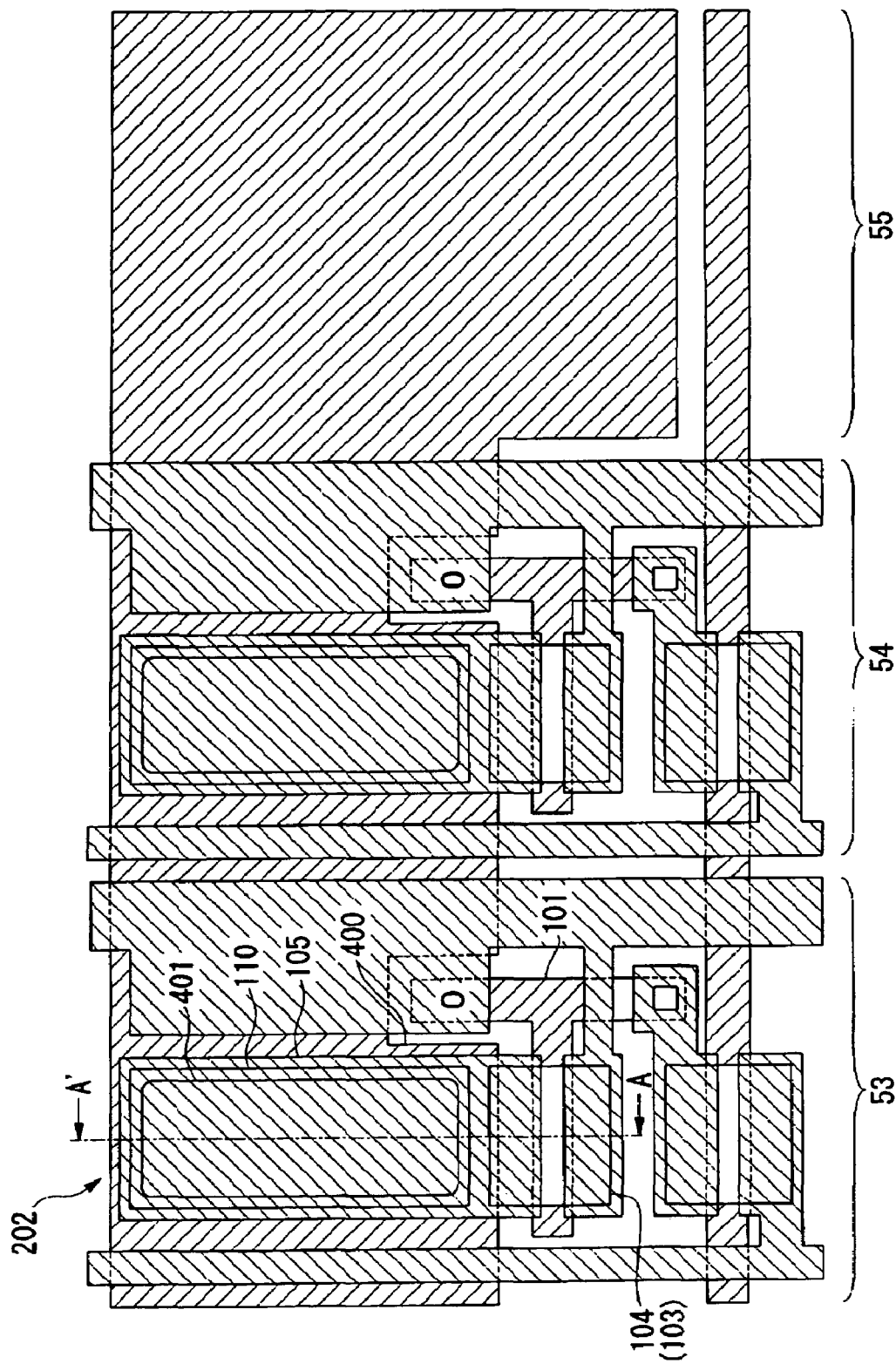
FIG. 6 is a plan view showing a configuration of a heat-release section placed in an electro-optical device according to an embodiment of the invention.

FIG. 6 is a plan view of area C, shown in FIG. 5(a), surrounded by the dotted-chain line. With reference to FIG. 6, the heat-release sections 400 each extend from the corresponding luminous sections 401 to corresponding sections other than the luminous sections 401. In particular, the sections other than the luminous sections 401 include portions of pixel regions 202 in the effective viewing area 201, the dummy pixel area 54 having no display function, and the non-display area 55 located outside the effective viewing area 201 and the dummy pixel area 54. According to such a configuration, heat generated from the luminous sections 401 is transmitted to the dummy pixel area 54 and the non-display area 55 lying on the perimeter of the insulating substrate 100 and then released.

The distance between the heat-release sections 400 and first electrodes 101 connected to the first or second thin-film transistors Tr1 or Tr2 of the pixels must be greater than or equal to the thickness of a first insulating layer 102 and less than or equal to the pitch between the pixels disposed in the same direction as the width direction (the horizontal direction in the figure) of the first electrodes 101, the distance being represented by D1, the thickness being represented by Td3 (Condition 1). This is because the heat transmitted through the heat-release sections 400 is prevented from being transmitted to the first electrodes 101 functioning as the gate electrodes of the first or second thin-film transistors or Tr1 or Tr2. When distance D1 is less than thickness Td3, a large amount of heat is transmitted to the first electrodes 101, whereby current-voltage properties of the first and second thin-film transistors Tr1 and Tr2 are varied. This variation causes an increase in current leaking from the first thin-film transistors Tr1 and image signals that must be retained in the pixels cannot therefore be securely retained therein, whereby the following display phenomena are caused: so-called vertical ghosts and/or tailing due to the cross talk between the image signals. Furthermore, in the second thin-film transistors Tr2, the variation causes an increase in the on-state current because of the temperature drift and a current that is larger than a value determined based on an image signal supplied to OLED semiconductor layers 112 flows, whereby display properties are impaired and current-luminance properties are seriously deteriorated. Those problems are serious when the first and second thin-film transistors Tr1 and Tr2 are made of a material, such as microcrystalline silicon or amorphous silicon, having high activation energy during the on-state. Hence, the problems must not be overlooked. When distance D1 is larger than the pixel pitch, heat cannot be sufficiently released; hence, the current-luminance properties of the OLED semiconductor layers 112 cannot be prevented from being deteriorated. When distance D1 satisfies Condition 1, problems in display and reliability can be prevented from occurring. With reference to FIG. 6, the heat-release sections 400 function as capacitor lines for controlling one of electrodes of each capacitor Cstg.

Since heat can be readily released through the heat-release sections 400, a difference between ambient temperature and the temperature of the OLED semiconductor layers 112 can be reduced during the emission of light; hence, the a change in the luminance and chromaticity of the electro-optical device due to temperature changes can be reduced. The term ambient temperature is herein defined as the temperature of an environment surrounding the electro-optical device. Thus, the electro-optical device can display an image with substantially a constant luminance and chromaticity without depending on the ambient temperature.

When the heat-release sections 400 contain the same material as that for forming the first electrodes 101 and/or have the same structure as that thereof, the heat-release sections 400 and the first electrodes 101 can be formed or processed in the same step; hence, a process for manufacturing the electro-optical device can be simplified. The heat-release sections 400 may contain the same material as that for forming, for example, the second electrodes 105 and/or have the same structure as that thereof depending on a method for manufacturing the thin-film transistors or the OLEDs 301. Furthermore, the heat-release sections 400 may contain the same material as that for forming, for example, additional electrodes for shielding the thin-film transistors from light and/or have the same structure as that thereof. In those configurations, the manufacturing process can also be simplified.

When the heat-release sections 400 have a thermal conductivity greater than or equal to that of one of each first OLED electrode 110 and each second OLED electrode 114, the one having a thermal conductivity larger than that of the other, the temperature of the OLED semiconductor layers 112 can be effectively decreased. When the heat-release sections 400 contain, for example, a material having the same thermal conductivity as that of a material for forming one of the first OLED electrode 110 and the second OLED electrode 114, the one having a thermal conductivity less than that of the other, the heat-release sections 400 have a thickness greater than that of the first OLED electrode 110 or the second OLED electrode 114. When heat-release sections 400 have the same thickness as that of the first OLED electrode 110 or the second OLED electrode 114, the one having a thermal conductivity less than that of the other, the heat-release sections 400 contain a material having a thermal conductivity less than that of a material for forming the one.

The second electrodes 105 connected to the first OLED electrodes 110 can each include one or more conductive layers having different thermal conductivities; hence, heat generated from the light-emitting elements can be efficiently transmitted to the heat-release sections 400 and temporarily stored in heat-conductive portions in the pixel regions 202 uniformly. Thus, the temperature distribution in the pixel regions 202 is uniform and the luminance of the light-emitting elements in each pixel is therefore uniform. Alternatively, the second electrodes 105 may have a multilayer structure consisting of at least two conductive layers having different thermal conductivities. One of the two layers is a first conductive layer 413 that is placed close to the first OLED electrodes 110 and the other is a second conductive layer 412 that is placed far from the same. The first conductive layer 413 has a thermal conductivity less than that of the second conductive layer 412. According to such a configuration, end portions of the OLED semiconductor layers 112 in the luminous sections 401 can be prevented from being locally cooled. Thus, the center portions of the luminous sections 401 as well as the end portions thereof are deteriorated in the current-luminance properties of the OLED semiconductor layers 112; hence, a uniform image can be displayed. The first conductive layer 413 contains aluminum nitride, titanium nitride, or chromium when the second conductive layer 412 contains aluminum, or the first conductive layer 413 contains indium tin oxide when the second conductive layer 412 contains chromium. For the first and second conductive layers 413 and 412, various combinations of materials may be employed.

The second electrodes 105, connected to the second thin-film transistors Tr2, adjacent to the impurity semiconductor layers 104 have a multilayer structure consisting of at least two conductive layers having different thermal conductivities. One of the two layers is a third conductive layer 411 that is placed close to the OLED semiconductor layers 112 and the other is the second conductive layer 412 that is placed far from the same. The third conductive layer 411 has a thermal conductivity less than that of the second conductive layer 412. The OLED semiconductor layer 112 and the second conductive layer 412 are preferably prevented from overlapping each other if possible. According to such a configuration, heat can be prevented from being transmitted to end portions of the drain regions of the thin-film transistors, whereby the increase in the on-state current of the thin-film transistors due to temperature drift can be prevented. Thus, the following problems due to an increase in the on-site current can be eliminated: changes in display properties and acceleration in deterioration in current-luminance properties. That advantage is particularly great when the thin-film transistors are made of a material, such as microcrystalline silicon or amorphous silicon, having high activation energy during the on-state. The third conductive layer 411 contains aluminum nitride, titanium nitride, or chromium when the second conductive layer 412 contains aluminum, or the third conductive layer 411 contains indium tin oxide when the second conductive layer 412 contains chromium. For the third and second conductive layers 411 and 412, various combinations of materials may be employed.

The distance between the second electrodes 105 functioning as the drain electrodes of the second thin-film transistors Tr2 is preferably greater than or equal to the distance between the first electrodes 101 and the intrinsic semiconductor layers 103 and is preferably less than or equal to the width of the first electrodes 101, the distance between the second electrodes 105 being represented by D3, the distance between the first electrodes 101 and the intrinsic semiconductor layers 103 being represented by Td1 (Condition 2). Channels at the side of the gate electrode in the drain regions of the thin-film transistors, which are connected to the first OLED electrodes 110, thereof are portions having high current density and those portions are most sensitive to temperature drift. The portions are preferably placed far from the first OLED electrodes 110 as specified in Condition 2 such that heat generated from the first OLED electrodes 110 can be prevented from being directly transmitted to the portions but is transmitted to the first electrodes 101 placed close to the first OLED electrodes 110, whereby the temperature of the portions can be prevented from being increased. According to such a configuration, the following problems due to an increase in the on-site current can be minimized: changes in display properties and acceleration in deterioration in current-luminance properties. That advantage is particularly great when the thin-film transistors are made of a material, such as microcrystalline silicon or amorphous silicon, having high activation energy during the on-state.

The distance between the luminous sections 401 and end portions of the second electrodes 105 functioning as the drain electrodes of the first or second thin-film transistors Tr1 or Tr2 is greater than or equal to the distance between the ribs 108 and the second electrodes 105 and is less than or equal to the pixel pitch, the distance between the luminous sections 401 and the end portions being represented by D2, the distance between the ribs 108 and the second electrodes 105 being represented by Td2. The ribs 108 preferably contain a light-absorbing material or are covered with a light-absorbing member when viewed in the direction of the thin-film transistors. Furthermore, the second electrodes 105 preferably contain a light-absorbing material or are covered with a light-absorbing member when viewed in the direction of the ribs 108. According to such a configuration, light leaking from the OLED semiconductor layers 112 can be sufficiently attenuated between the ribs 108 and the second electrodes 105, whereby currents leaking from the first thin-film transistors Tr1 or currents, supplied to the second thin-film transistors Tr2, for controlling the tone can be prevented from being increased. Thus, the following display phenomena can be prevented from occurring: changes in tone properties, so-called vertical ghosts, and/or tailing due to the cross-talk between the image signals.

Examples of the light-absorbing material for forming the ribs 108 include a black resin containing, for example, porous carbon particles dispersed therein. Examples of the light-absorbing material for forming the second electrodes 105 include metals, such as black titanium and chromium, having low reflectance and oxide semiconductors such as chromium oxide and indium tin oxide.

In the embodiments described above, the electro-optical devices including the organic EL elements functioning as electro-optical elements are described. However, the present invention is not limited to the embodiments and can be applied to other electro-optical devices (inorganic LED display units, field emission display units, and the like) of which the luminance is varied depending on the driving current. In the embodiments, the electro-optical devices include the thin-film transistors; however, the devices may include thin-film diodes.

The electro-optical device according to any one of the embodiments can be used for manufacturing various electronic apparatuses, such as televisions, projectors, mobile phones, portable terminals, mobile computers, and personal computers. Those apparatuses including the electro-optical device have a high commercial value and the sales appeal of the apparatuses can be enhanced in the market.

While this invention has been described in conjunction with the specific embodiments thereof, it is evident that many alternatives, modifications, and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. An electro-optical device, comprising:
a substrate;
a plurality of scanning lines;
a plurality of signal lines;
a plurality of display pixel regions, arranged corresponding to intersections of the scanning lines and the signal lines, disposed on the substrate; and
a plurality of dummy pixel regions arranged in a peripheral region surrounding the display pixel regions.
heat-release sections,
the display pixel regions each including corresponding light-emitting elements and corresponding driving circuits that drive the light-emitting elements, the light-emitting elements emitting light in a direction that light is withdrawn, and the heat-release sections being located on a side opposite to the light-withdrawing direction of the light-emitting elements and extending in the display pixel regions and the dummy pixel regions.

2. The electro-optical device according to claim 1, the light-withdrawing direction being opposite to a direction in which the substrate is placed and the heat-release sections being placed between the light-emitting elements and the substrate.

3. The electro-optical device according to claim 1, the heat-release sections each extending from corresponding luminous sections to corresponding non-luminous sections and heat generated from the light-emitting elements being transmitted to portions of the heat-release sections extending in the non-luminous sections.

4. The electro-optical device according to claim 3, the heat-release sections extending in the non-luminous sections each extending to corresponding non-luminous portions each placed in the corresponding pixel regions.

5. The electro-optical device according to claim 1, the heat-release sections being disposed between the corresponding driving circuits and the corresponding light-emitting elements and functioning as portions of light-shielding section that shield the driving circuits from light emitted from the light-emitting elements.

6. The electro-optical device according to claim 1, the heat-release sections containing a same material as that for forming any one of electrodes coupled to the driving circuits and having a same layer structure as that of the electrode.

7. The electro-optical device according to claim 6, a distance between each heat-release section and the electrode coupled to the driving circuit being greater than or equal to a thickness of an insulating layer disposed between the light-emitting elements and the heat-release sections, and being less than or equal to a pitch between the pixel regions.

8. An electronic apparatus, comprising the electro-optical device according to claim 1.

9. An electro-optical device, comprising:
a substrate;
a plurality of scanning lines;
a plurality of signal lines;
a plurality of pixel regions, arranged corresponding to intersections of the scanning lines and the signal lines, disposed on the substrate; and
heat-release sections,
the pixel regions each including corresponding light-emitting elements and corresponding driving circuits that drive the light-emitting elements, the light-emitting elements emitting light in a direction that light is withdrawn, and the heat-release sections being located on a side opposite to the light-withdrawing direction of the light-emitting elements and having a thermal conductivity greater than or equal to that of a first electrode that is one of a plurality of electrodes coupled to the light-emitting elements and having a highest thermal conductivity.

10. The electro-optical device according to claim 9, the heat-release sections having a thermal conductivity greater than that of the first electrode.

11. The electro-optical device according to claim 9, the heat-release sections having a thickness greater than that of the first electrode.

12. An electro-optical device, comprising:
a substrate;
a plurality of scanning lines;
a plurality of signal lines;
a plurality of pixel regions, arranged corresponding to intersections of the scanning lines and the signal lines, disposed on the substrate; and
heat-release sections,
the pixel regions each including corresponding light-emitting elements and corresponding driving circuits that drive the light-emitting elements, the light-emitting elements emitting light in a direction that light is withdrawn, and the heat-release sections being located on a side opposite to the light-withdrawing direction of the light-emitting elements;
a plurality of the pixel regions each including corresponding heat-conductive sections, each being disposed between the corresponding heat-release sections and the corresponding light-emitting elements, each including at least one first heat-conductive layer.

13. The electro-optical device according to claim 12, the heat-conductive sections being each disposed between the corresponding driving circuits and the corresponding light-emitting elements and each including corresponding third heat-conductive layers located on the side close to the driving circuits, and the third heat-conductive layers having a thermal conductivity less than that of the first heat-conductive layers.

14. The electro-optical device according to claim 12, the heat-conductive sections each including corresponding second heat-conductive layers located on a side close to the light-emitting elements and third heat-conductive layers located on the side close to the driving circuits, the second heat-conductive layers having a thermal conductivity less than that of the first heat-conductive layers and the third heat-conductive layers having a thermal conductivity less than that of the first heat-conductive layers.

15. The electro-optical device according to claim 12, the heat-conductive sections each including corresponding second heat-conductive layers located on a side close to the light-emitting elements and the second heat-conductive layers having a thermal conductivity less than that of the first heat-conductive layers.

16. The electro-optical device according to claim 12, the heat-conductive sections each being disposed between the corresponding driving circuits and the corresponding light-emitting elements and functioning as portions of light-shielding section that shield the driving circuits from light emitted from the light-emitting elements.

17. An electro-optical device, comprising:
a substrate;
a plurality of scanning lines;
a plurality of signal lines;
a plurality of pixel regions, arranged corresponding to intersections of the scanning lines and the signal lines, disposed on the substrate; and
heat-release sections,
the pixel regions each including corresponding light-emitting elements and corresponding driving circuits that drive the light-emitting elements, the light-emitting elements emitting light in a direction that light is withdrawn, and the heat-release sections being located on a side opposite to the light-withdrawing direction of the light-emitting elements and containing a same material as that for forming one of electrodes coupled to the driving circuits and have a same layer structure as that of the electrode.

18. The electro-optical device according to claim 17, the heat-release sections having faces facing the light-emitting elements and the faces or the second heat-conductive layers absorbing at least light.

19. The electro-optical device according to claim 17, further comprising partitions, disposed above the driving circuits, that isolate the luminous sections from each other, the partitions having faces fronting in the light-withdrawing direction and the faces absorbing at least light.

20. An electro-optical device, comprising:
a substrate;
a plurality of scanning lines;
a plurality of signal lines;
a plurality of pixel regions, arranged corresponding to intersections of the scanning lines and the signal lines, disposed on the substrate; and
heat-release sections,
the pixel regions each including corresponding light-emitting elements and corresponding driving circuits that drive the light-emitting elements, the light-emitting elements emitting light in a direction that light is withdrawn, and the heat-release sections being located on a side opposite to the light-withdrawing direction of the light-emitting elements and extending in the non-luminous sections extending to an outer area surrounding an area containing a plurality of the pixel regions.

* * * * *